(12) United States Patent
Possley

(10) Patent No.: US 7,729,415 B1
(45) Date of Patent: Jun. 1, 2010

(54) HIGH-SPEED INTERFACE FOR A PROGRAMMABLE DEVICE

(75) Inventor: Nicholas J. Possley, Gilroy, CA (US)

(73) Assignee: Xilinx, Inc., San Jose, CA (US)

( * ) Notice: Subject to any disclaimer, the term of this patent is extended or adjusted under 35 U.S.C. 154(b) by 1022 days.

(21) Appl. No.: 11/353,652

(22) Filed: Feb. 14, 2006

(51) Int. Cl.
*H04B 1/38* (2006.01)

(52) U.S. Cl. .................. 375/219; 370/545; 375/354

(58) Field of Classification Search ............... 370/464, 370/498, 545; 713/400; 375/219, 354, 355, 375/365, 373, 376; 710/20, 21, 25, 300, 710/306
See application file for complete search history.

(56) References Cited

U.S. PATENT DOCUMENTS

| | | | | |
|---|---|---|---|---|
| 6,631,144 | B1 * | 10/2003 | Johansen | 370/516 |
| 6,871,301 | B1 * | 3/2005 | Deng | 714/700 |
| 7,301,996 | B1 * | 11/2007 | Chi et al. | 375/226 |
| 7,346,794 | B1 * | 3/2008 | Davidson et al. | 713/400 |
| 2003/0039212 | A1 * | 2/2003 | Lloyd et al. | 370/235 |
| 2005/0058187 | A1 * | 3/2005 | Groen et al. | 375/219 |
| 2005/0058290 | A1 * | 3/2005 | Kryzak et al. | 380/268 |

OTHER PUBLICATIONS

Serdes Framer Interface Level(SFI-4) Phase 2: Implementation Agreement OIF-SFI4-02.0.*
Voegele, Kevin et al., "SERDES Framer Interface Level 4 (SFI-4) Phase 2: Implementation Agreement for 10 Gb/s Interface for Physical Layer Devices", OIF-SFI4-02.0, Sep. 12, 2002, pp. 1-31, available from The Optical Internetworking Forum, 39355 California Street, Suite 307, Fremont, CA 94538.

* cited by examiner

*Primary Examiner*—William Trost, IV
*Assistant Examiner*—Siming Liu
(74) *Attorney, Agent, or Firm*—W. Eric Webostad

(57) ABSTRACT

A high-speed interface for implementation in a programmable device such as, e.g., a programmable logic device ("PLD") is described. Multi-gigabit transceivers of the PLD provide transmit and receive lock signals and have inputs for reference transmit and receive clock signals. One of the multi-gigabit transceivers provides a first transmit clock signal, a first receive clock signal, and a second receive clock signal. A data rate converter fractionally multiplies a second transmit clock signal to provide the reference transmit clock signal. A skew synchronization block obtains respective transmit and receive lock signals from the multi-gigabit transceivers and provides respective receive and transmit synch adjustment signals to the multi-gigabit transceivers. Synchronous operation of the multi-gigabit transceivers in receive and transmit directions is adjusted with receive and transmit synch adjustment signals to maintain lane-to-lane skew for the high-speed interface within a target range.

18 Claims, 9 Drawing Sheets

HIGH-SPEED INTERFACE FOR A PROGRAMMABLE DEVICE

FIELD OF THE INVENTION

One or more aspects of the invention relate generally to a high-speed interface and, more particularly, to a serializer-deserializer to framer interface implemented in a programmable logic device ("PLD").

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

An example of such an FPGA is the Virtex-4™ FX available from Xilinx, Inc., 2100 Logic Drive, San Jose, Calif. 95124. FPGAs use configuration memory. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

A serializer-deserializer ("SERDES") to Framer Interface ("SFI") may provide transport of data. The Optical Internetworking Forum ("OIF") is an industry group that promotes the development of interoperable, inter-network specifications and associated technologies. The OIF put forth a Specification for SFI Level 4 Phase Two ("SFI-4.02") following the SFI Level 4 Phase One ("SFI-4.01") Specification. Generally, an SFI aggregates data bandwidths for payload data rates of about 10 gigabits per second ("Gb/s") and higher. Unfortunately, the SFI-4.02 Specification is extremely constrained with respect to a variety of parameters, including lane-to-lane skew. Heretofore, implementing a design meeting the SFI-4.02 Specification was limited to Application Specific Integrated Circuits ("ASICs"), which, among other things, have a slower time to market and a higher cost with respect to lower volume applications than FPGAs.

Accordingly, it would be desirable and useful to provide an interface in a PLD that is capable of meeting at least approximately a 10 Gb/s data rate while having a lane-to-lane skew that at least meets that specified in the SFI-4.02 Specification.

SUMMARY OF THE INVENTION

One or more aspects of the invention generally relate to a high-speed interface and, more particularly, to a serializer-deserializer to framer interface implemented in a programmable logic device.

An aspect of the invention is a high-speed interface for implementation in a programmable logic device. Multi-gigabit transceivers of the programmable logic device each include locked-loop circuitry to provide transmit and receive lock signals. The multi-gigabit transceivers are configured with inputs for a reference transmit clock signal and a reference receive clock signal. One of the multi-gigabit transceivers is configured to provide a first transmit clock signal, a first receive clock signal, and a second receive clock signal. The first transmit clock signal is provided responsive to the reference transmit clock signal. The first receive clock signal and the second receive clock signal are provided responsive to the reference receive clock signal or received data. The first receive clock signal has a first frequency. The second receive clock signal has a second frequency different from the first frequency of the first receive clock signal. The multi-gigabit transceivers are coupled to obtain the first transmit clock signal and the first receive clock signal to include feed back of the first transmit clock signal and the first receive clock signal to the one of the multi-gigabit transceivers. The first transmit clock signal is for providing a transceiver reference clock signal to each of the multi-gigabit transceivers. A data rate converter is coupled to obtain a second transmit clock signal and is configured to fractionally multiply the second transmit clock signal to provide the reference transmit clock signal. A skew synchronization block is coupled to obtain the transmit and receive lock signals from each of the multi-gigabit transceivers. The skew synchronization block is configured to provide respective receive and transmit synch adjustment signals to each of the multi-gigabit transceivers. The receive and transmit synch adjustment signals are for respectively adjusting synchronous operation of the multi-gigabit transceivers in receive and transmit directions to maintain lane-to-lane skew for the high-speed interface within a target range.

Another aspect of the invention is a method for providing a high-speed interface comprising providing a programmable logic device having multi-gigabit transceivers and programmable logic. Each of the multi-gigabit transceivers is coupled to obtain transmit reference clock signaling and receive reference clock signaling. One of the multi-gigabit transceivers is configured to provide transmit and receive output clock signaling. The transmit and receive output clock signaling are provided as a first receive portion, a second receive portion and a transmit portion, where the first receive portion and the second receive portion have different frequencies. The transmit portion is provided responsive to the transmit reference clock signaling. The first receive portion and the second receive portion are provided responsive to the receive reference clock signaling or received data. The first receive portion and the transmit portion are obtained by each of the multi-gigabit transceivers. A transceiver clock signal is provided to each of the multi-gigabit transceivers responsive to the transmit portion. A data rate converter coupled to obtain a transmit input clock signal and configured to fractionally multiply the transmit input clock signal is instantiated to provide the transmit reference clock signal. A controller coupled to obtain respective transmit and receive lock signals from each of the multi-gigabit transceivers is instantiated in the programmable logic. Respective sets of receive and transmit synch adjustment signals are obtained from the controller by each of the multi-gigabit transceivers. Synchronous operation of the multi-gigabit transceivers is adjusted in receive and transmit directions to maintain lane-to-lane skew for the high-speed interface within a target range, where the adjusting in the receive and transmit directions is respectively responsive to the receive and transmit synch adjustment signals.

Yet another aspect of the invention is a system in a programmable logic device. including at least one first interface compatible with a first serializer-deserializer to framer interface specification and at least one second interface compatible with a second serializer-deserializer to framer interface specification. A switch block couples the at least one first interface with the at least one second interface. A processor interface is coupled to the switch block for providing configuration information thereto and coupled to the at least one first interface. A digital clock manager is for being coupled to a reference clock source for providing a plurality of clock signals in the programmable logic device. The at least one first interface is further described. Multi-gigabit transceivers of the programmable logic device each include locked-loop circuitry to provide transmit and receive lock signals. The multi-gigabit transceivers are configured with inputs for a reference transmit clock signal and a reference receive clock signal. One of the multi-gigabit transceivers is configured to provide a first transmit clock signal, a first receive clock signal, and a second receive clock signal. The first transmit clock signal is provided responsive to the reference transmit clock signal. The first receive clock signal and the second receive clock signal are provided responsive to the reference receive clock signal or receive data. The first receive clock signal has a first frequency. The second receive clock signal has a second frequency different from the first frequency of the first receive clock signal. The multi-gigabit transceivers are coupled to obtain the first transmit clock signal and the first receive clock signal to include feed back of the first transmit clock signal and the first receive clock signal to the one of the multi-gigabit transceivers. The first transmit clock signal is for providing a transceiver reference clock signal to each of the multi-gigabit transceivers. A descrambler is coupled to obtain the receive data from the multi-gigabit transceivers. The descrambler configured to align the receive data and to strip synch bits from the receive data. The one of the multi-gigabit transceivers is coupled to the descrambler to provide the second receive clock signal thereto. A scrambler is coupled to obtain the second transmit clock signal and to obtain transmit data. The scrambler is configured to add synch bits to the transmit data and to apportion the transmit data to the multi-gigabit transceivers for transmission. A data rate converter is coupled to obtain a second transmit clock signal and is configured to fractionally multiply the second transmit clock signal to provide the reference transmit clock signal. A skew synchronization block is coupled to obtain respective transmit and receive lock signals from each of the multi-gigabit transceivers. The skew synchronization block is configured to provide respective receive and transmit synch adjustment signals to each of the multi-gigabit transceivers. The receive and transmit synch adjustment signals are for respectively adjusting synchronous operation of the multi-gigabit transceivers in receive and transmit directions to maintain lane-to-lane skew for the high-speed interface within a target range.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
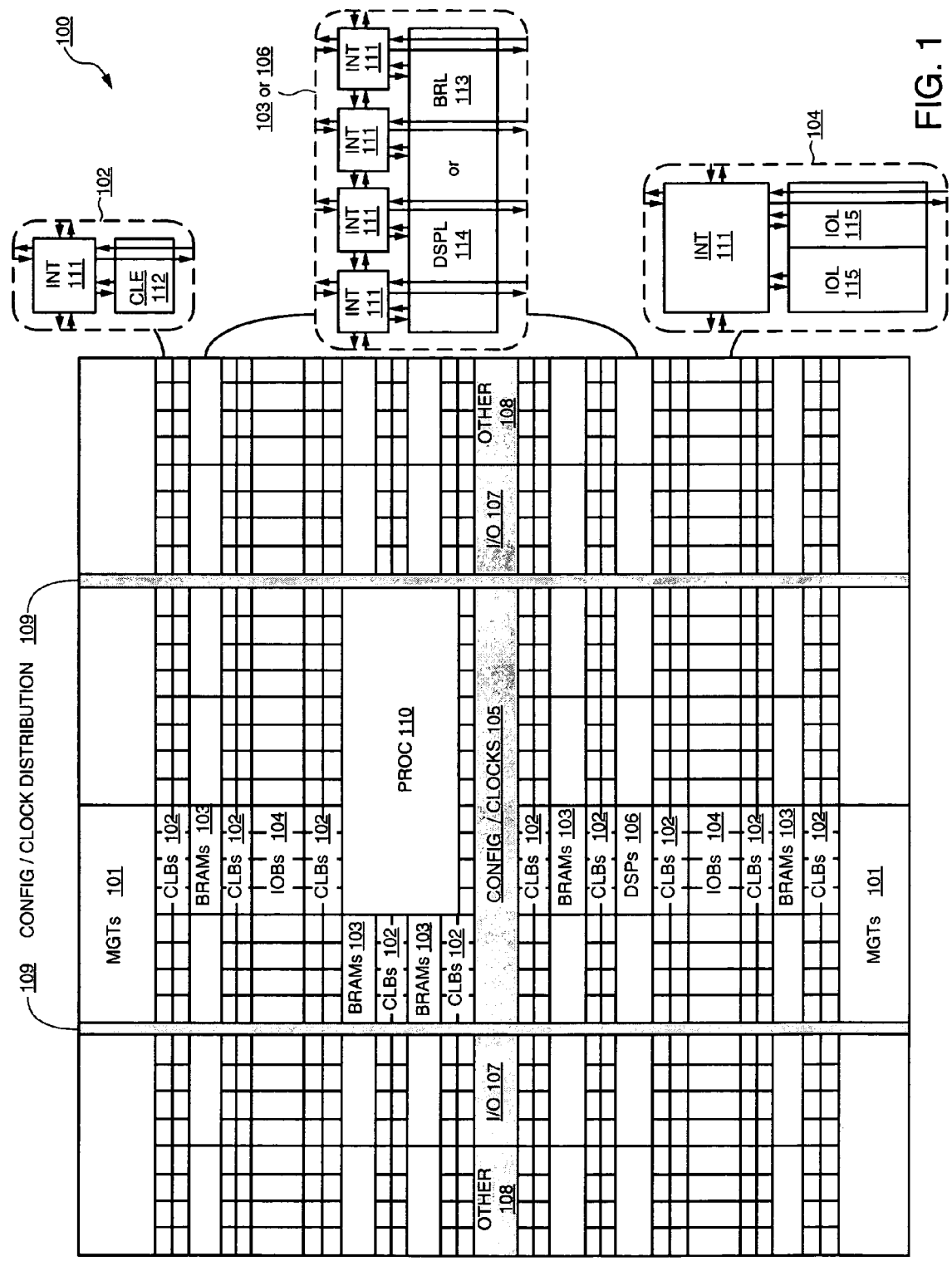
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include one or more dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
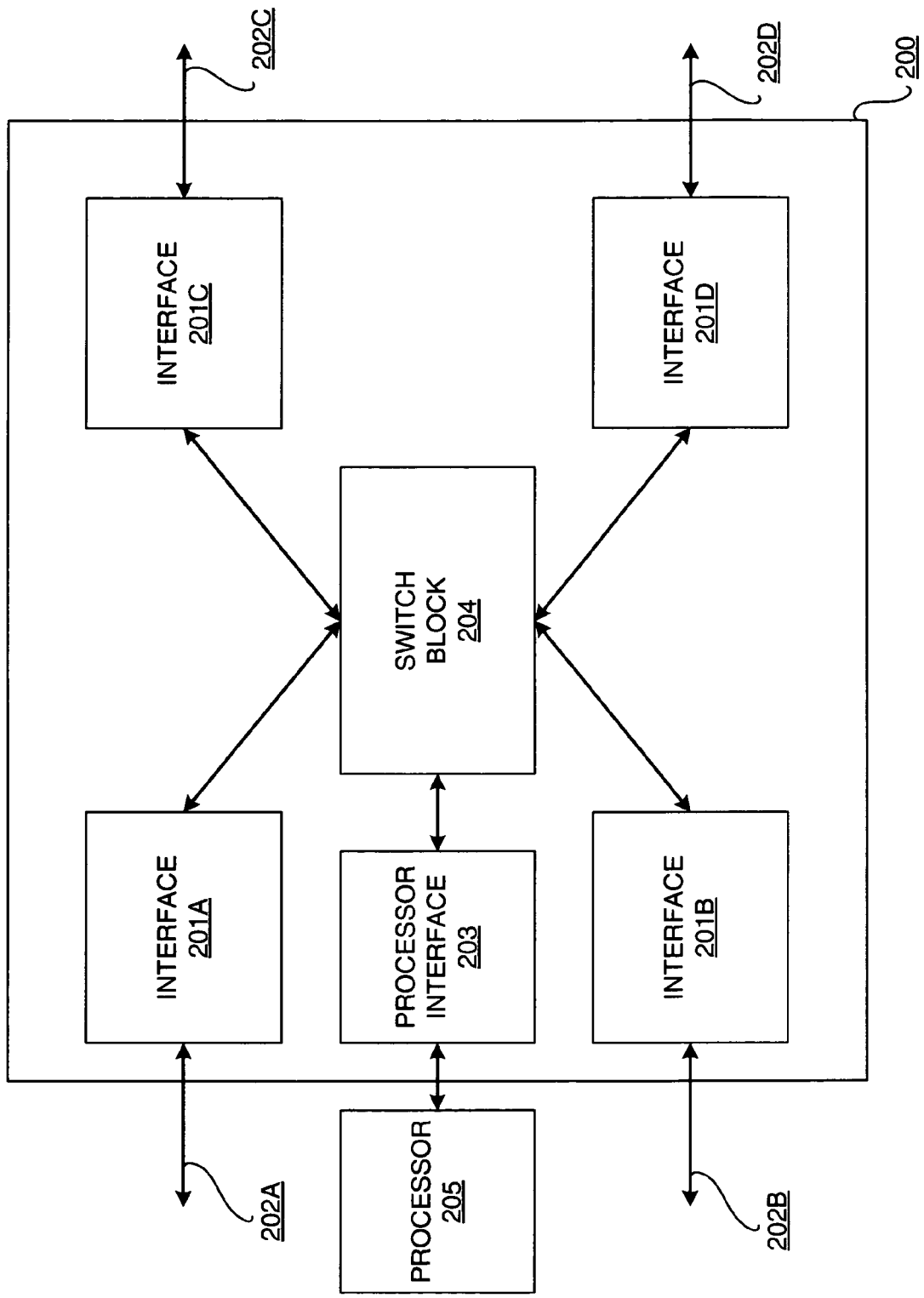
FIG. 2 is an application layer block diagram depicting an exemplary embodiment of a line card FPGA.

FIG. 2 is an application layer block diagram depicting an exemplary embodiment of a line card FPGA 200. It should be appreciated that line card FPGA 200 may be implemented in an FPGA, such as FPGA 100 of FIG. 1. Line card FPGA 200 includes transceiver interfaces ("interfaces") 201A through 201D, processor interface 203, and switch interconnect/pattern generator ("switch block") 204.

Processor interface 203 may be for coupling to an external microprocessor 205 coupled to line card FPGA 200. Alternatively, an embedded processor in FPGA 100, for example, may be used instead of external microprocessor 205. Furthermore, alternatively, a processor may configured in programmable logic of FPGA 100 of FIG. 1 as is known, and such programmable logic-provided processor ("soft processor") may be used as an internal processor for an FPGA used to implement line card FPGA 200.

Interfaces 201A and 2018 may be SFI-4.02-compliant interfaces, and interfaces 201C and 201D may be SFI-4.01-compliant interfaces. Accordingly, data traffic 202A through 202D respectively associated with interfaces 201A through 201D may each have a data rate of approximately 10 Gb/s or more in compliance with SFI-4.02 and SFI-4.01 specifications.

Interfaces 201A through 201D are commonly coupled for bidirectional communication with one another via switch block 204. Switch block 204 may be implemented with crossbar switching technology, as described below in additional detail. However, it should be mentioned that switch block 204 may be used to couple line cards, such as line card FPGAs 200, to one another for protection switching. Thus, switch block 204 may be dynamically configured within a window of time for supporting such protection switching. As programmable logic of an FPGA may be used to implement switch block 204, it should be appreciated that such dynamic configuration may be facilitated by use of programmable logic. Additionally, switch block 204 may be configured to support full defect monitoring for fault management.

Notably, any interface of interfaces 201A through 201D may communicate with one or more than one other interface of interfaces 201A through 201D. Each of interfaces 201A through 201D is data direction asynchronous with respect to one another. For transparent transport of data, clock signals are provided to interfaces 201A through 201D in a forward direction.

Processor interface 203 provides configuration and control of switching in defect monitoring for fault management by switch block 204. Processor interface 203 may be a generic asynchronous bus interface; such interfaces are well known and thus not described in unnecessary detail herein for purposes of clarity. With respect to fault management, register-based and pin-based reset and disable may be available for each interface 201A through 201D for fault mitigation. Moreover, an interrupt may be available that is a summary of all defect conditions for interfaces 201A through 201D on an interface-by-interface basis. Furthermore, each defect condition per interface of interfaces 201A through 201D may be individually masked.

Figure 3:
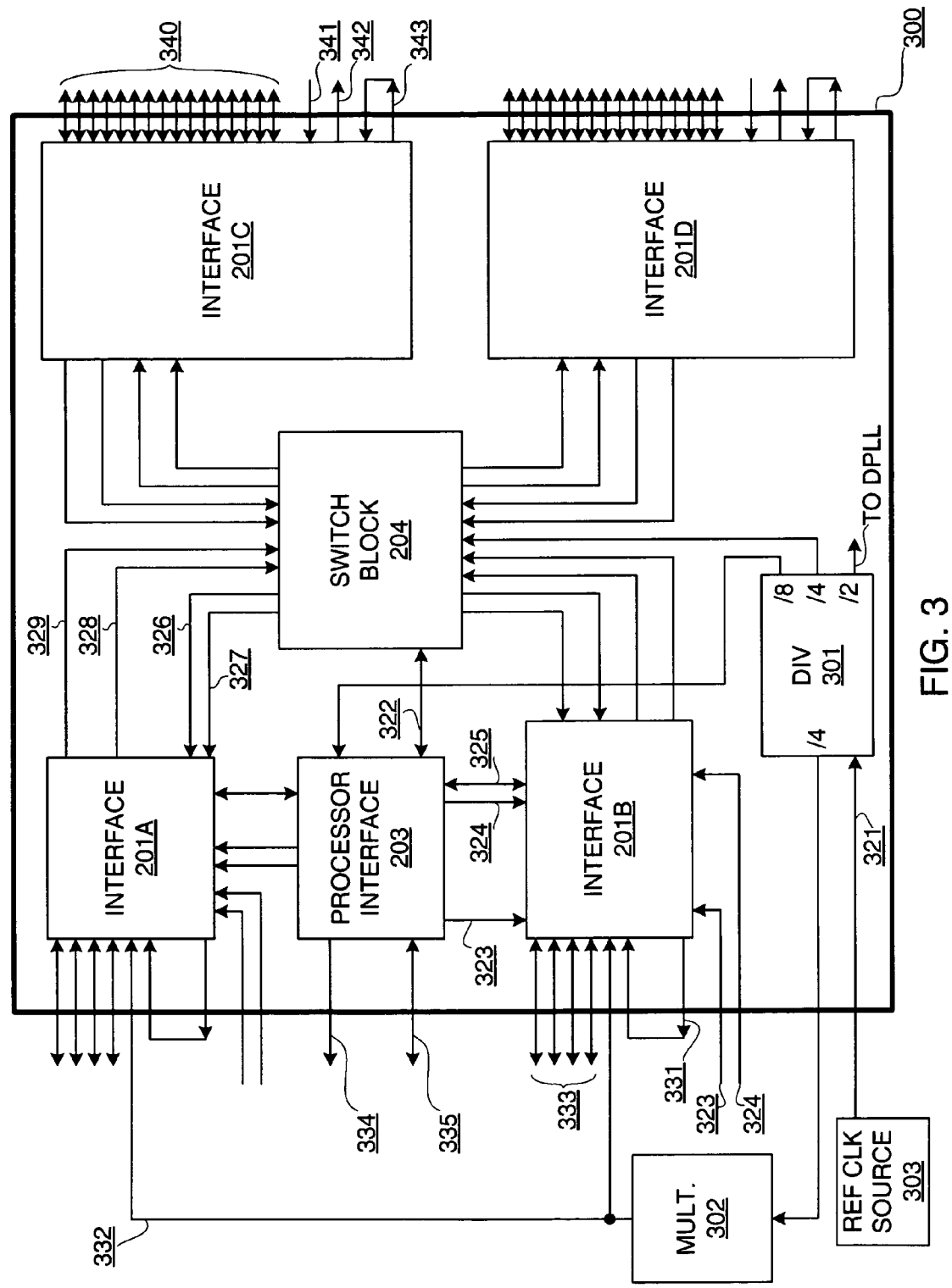
FIG. 3 is the application layer block diagram of FIG. 2 indicating signal interfaces between blocks for an implementation of a line card FPGA.

FIG. 3 is the application layer block diagram of FIG. 2 indicating signal interfaces between blocks for an implementation of a line card FPGA 300. A reference clock source 303 is used to provide a reference clock signal 321 to divider 301. Reference clock signal 321 from reference clock source 303 has a frequency, which for this particular implementation is a date rate divide-by-16 signal (i.e., data rate/16). Notably, specific numerical examples are provided for purposes of clarity and not limitation, as it will be appreciated by those of ordinary skill in the art that in other implementations other numerical values may be used.

Divider 301 may have a divide-by-2 output for dividing the frequency of reference clock signal 321 by two for a digital phase locked loop ("DPLL") embodiment, which is described below in additional detail. Divider 301 may have one or more divide-by-4 output ports for dividing down the frequency of reference clock signal 321 by four for switch block 204 or multiplier 302, or both.

For an SFI-4.02 interface, clock signals may be multiplied in the transmit ("TX") direction in order to accommodate a transition from 64 to 66 bits. Accordingly, for MGTs with respective 32-bit data interfaces, multiplier 302 may be a 33/32 fractional multiplier for this transition. Conventionally, a fractional multiplier includes a phase locked loop ("PLL"), and thus in this embodiment such PLL of multiplier 302 is external to line card FPGA 300 to provide this 33/32 fractional multiplication. Notably, an external multiplier 302 may be omitted in favor of an internal 33/32 fractional multiplier of an FPGA, or may be omitted entirely where receive clock signals are derived solely from received data.

Another output of divider 301 may have a divide-by-8 output port coupled to processor interface 203. Processor interface 203 may be used to provide interrupt signaling 334 to a processor, as well as bidirectional communication of address and data signaling 335 to and from such processor. Furthermore, configuration information may be bidirectionally communicated between processor interface 203 and switch block 204 via configuration signal 322.

Processor interface 203 may be used to provide reset signal 323 and transmit disable signal 324 to interface 201B, as well as bidirectional communication of defects configuration to interface 201B via defects configuration signaling 325. Reset, transmit disable, and defects configuration signaling may be similarly provided between processor interface 203 and interface 201A as well.

Notably, the same sets of signaling between interfaces 201A through 201D and switch block 204 are used, and thus only one of such sets is described (using 201A as an example) for purposes of clarity. Input clock signal 327 and input data signaling 326 from switch block 204 are provided to interface 201A. For an embodiment, input data signaling 326 may be provided as 64 bits of data with an input clock signal 327 having a frequency set at the data rate divided by 64. Output data signaling 328 and output clock signal 329 are provided from interface 201A to switch block 204. For an embodiment, output data signaling 328 may be provided as 64 bits of data in with an output clock signal 329 having a frequency set at the data rate divided by 64. Notably, the data rate may vary from application to application.

For a Xilinx FPGA embodiment, interfaces 201A and 201B may have pin inputs for reset and transmit disable signaling, which may be set as part of configuration of line card FPGA 300 rather than using processor interface 203 for such signaling. Thus, as illustratively shown for interface 201B, reset signal 323 and transmit disable signal 324 may be provided via pin input. Furthermore, for a Xilinx FPGA embodiment, a transmit clock output pin for interfaces 201A and 201B may be fed back to an MGT transmit clock input pin. Thus, for example, with reference to interface 201B, transmit clock output signal 331 is provided from a pin of line card FPGA 300, and fed back to another pin of line card FPGA 300 as an MGT transmit input clock signal. As will become more apparent, this signaling is used to provide a reference MGT from MGTs of an interface, such as interface 201B.

When multiplier 302 is used, output of multiplier 302 may be provided via pin inputs to interfaces 201A and 201B as an MGT receive ("RX") reference clock signal 332. As described below in additional detail with reference to FIG. 4, four MGTs may be used for each interface 201A and 201B, namely MGTs 1 through 4 (not shown in FIG. 3). Accordingly, receive and transmit signal pairs for each of such four MGTs may be used for respectively communicating data to and from interfaces 201A and 201B with for external communication with line card FPGA 300. These receive and transmit pairs are illustratively shown for interface 201B as input/output ("I/O") signals 333.

Notably, interfaces 201C and 201D each have a set of I/O signals 340, which in this embodiment are for 16 bits of data. Moreover, interfaces 201C and 201D each have a receive input clock 341, a transmit data output data clock 342, and a transmit output clock 343. Each transmit output clock 343 is fed back to its respective interface from which it originated as a transmit input clock. Notably, for example, for 16 bit words, frequency of each of these clock signals 341 through 343 is the data rate divided by 16. Interfaces 201C and 201D may be conventional. Alternatively, interfaces 201C and 201 D may have an improved IOB SERDES, as described below in additional detail with reference to FIG. 9.

Figure 4:
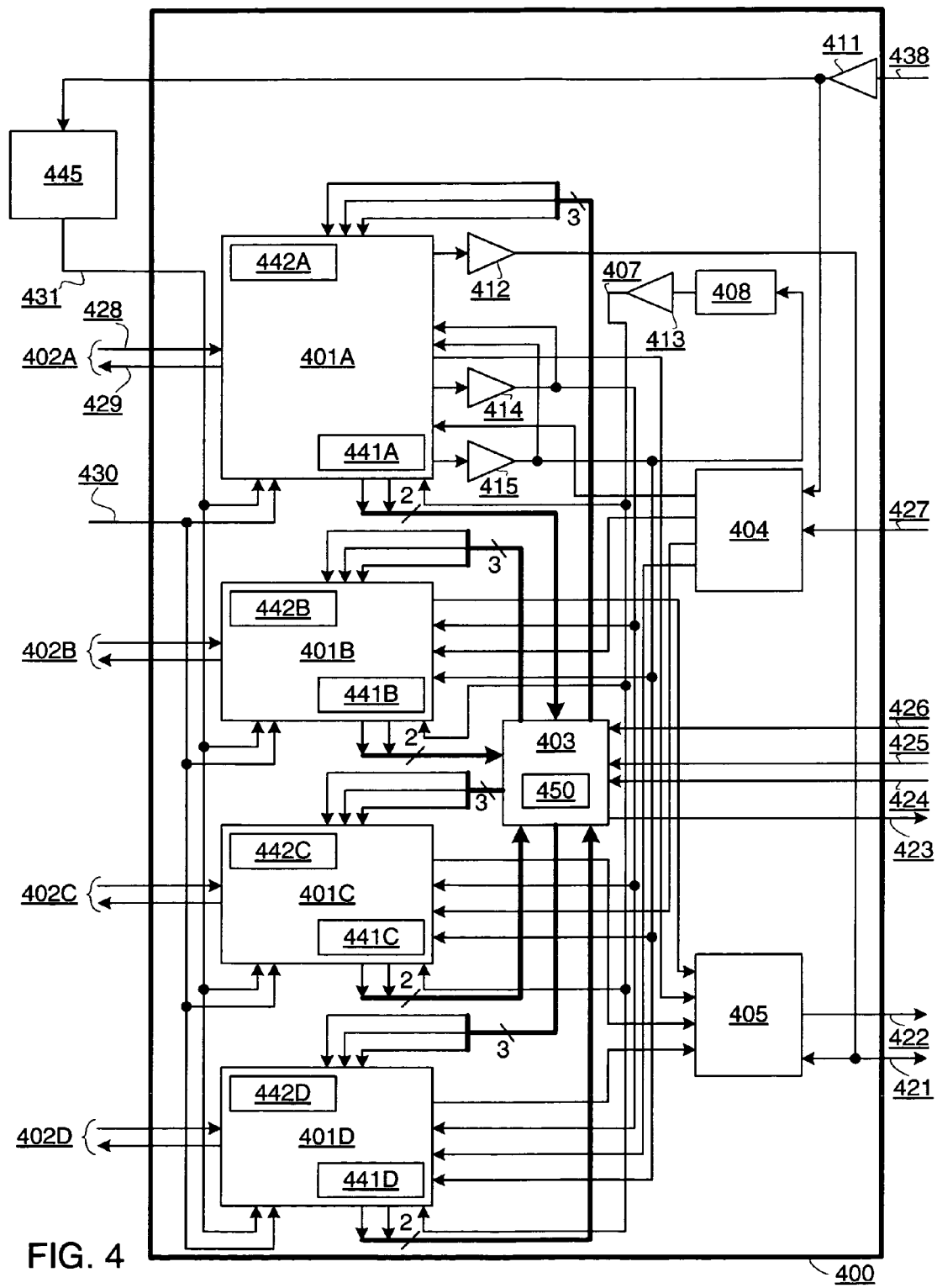
FIG. 4 is a block/schematic diagram depicting an exemplary embodiment of a transceiver interface for SFI-4.02 implementation in programmable logic of an FPGA.

FIG. 4 is a block/schematic diagram depicting an exemplary embodiment of a transceiver interface ("interface") 400 for implementation in programmable logic of an FPGA. Interface 400 may be used for an interface 201A or 201B of FIGS. 2 and 3. Notably, interface 400 in this particular embodiment is for an SFI-4.02 application implemented in a Xilinx FPGA having MGTs and Digital Clock Managers ("DCMs"). However, it should be appreciated that interface 400 is not limited to SFI-4.02 applications and may be used in other applications having equal or higher communication data rates.

In this particular embodiment, four MGTs 401A through 401D are used for serial communication at approximately 2.5 Gb/s for each of four separate lanes. Accordingly, these four lanes, generally indicated as 402A through 402D, in combination provide approximately at least a 10 Gb/s interface for receive and transmit directions. Thus, each MGT 401A through 401D has a receive input, such as receive input 428 of lane 402A, and a transmit output, such as transmit output 429 of lane 402A. In this configuration one of MGTs 401A through 401D is used to provide a reference for purposes of clocking the other MGTs to provide synchronous operation. In this particular example MGT 401A is used as the reference MGT; however, any one of MGTs 401A through 401D may be used as a reference MGT. Notably, signals illustratively shown in FIG. 4 to the left of interface 400, as well as multiplier 302, are "off-chip" from an FPGA used to implement interface 400, and signals illustratively shown in FIG. 4 to the right of interface 400 are internal FPGA signals.

Each of MGTs 401A through 401D receives an MGT transmit reference clock signal 431, which may be output from multiplier 445. Multiplier 445, though it may be an external 33/32 multiplier PLL, is not multiplier 302 of FIG. 3. Multiplier 445 receives a buffered transmit clock input signal 438 from buffer 411 to provide MGT transmit reference clock signal 431. Additionally, each of MGTs 401A through 401D receives an MGT receive reference clock signal 430 which may optionally be provided from multiplier 302 of FIG. 3 as indicated with reference to MGT receive reference clock signal 332.

MGT 401A provides a first receive clock output signal to buffer 412 and provides a second receive clock output signal to buffer 414. These first and second receive clock output signals may be provided responsive to an MGT receive reference clock signal 430, such as may be provided from multiplier 302 of FIG. 3 when such MGT is unlocked; otherwise, these first and second receive clock output signals are derived from received data. Generally, these first and second receive clock output signals are isochronous as they both originate from a same clock source, though they may be somewhat out of phase with respect to one another. Each of buffers 411 through 415 may be what is known as a "global buffer" ("BUFG") of an FPGA. Output from buffer 414 is fed back to MGT 401A as a receive user clock signal. For this example, frequency of this receive user clock signal is the data rate divided by 66. The output of buffer 414 is further provided as a receive user clock signal input to each of MGTs 401B through 401D.

Output of buffer 412 is provided as a receive clock output signal 421. For this example, receive clock output signal 421 has a frequency which is the data rate divided by 64. Receive clock output signal 421 is provided to receive alignment/descrambling/synch bit de-multiplexer block ("receive descrambler") 405 and to switch block 402 of FIG. 3 (not shown in FIG. 4).

Receive descrambler 405 looks for the synch bits, such as a pattern of logic 0s and 1s, for some amount of data in order to determine that such bits are synch bits for words. These synch bits may be removed by receive descrambler 405 at the data rate divided by 64, responsive to the receive clock output from buffer 412. Thus, receive descrambler 405 provides 64 bit words as receive data signal 422.

MGT 401A provides a transmit clock output signal to buffer 415. This transmit clock output signal provided to buffer 415 may be responsive to a transmit reference clock signal provided to MGT 401A, such as MGT transmit reference clock signal 431. Notably, a separate IOB clock, such as IOB clock block 930 of FIG. 9, may be used to provide a transmit output clock. Output of buffer 415 is fed back to MGT 401A as a transmit user clock signal and is provided to each of MGTs 401B through 401D as a transmit user clock signal. For this example, frequency of this output from buffer 415 is the data rate divided by 66. Additionally, output of buffer 415 is provided as an input to divider 408, which is described below in additional detail.

Each of MGTs 401A through 401D generally receive the same types of signals. Accordingly, for purposes of clarity, only signaling associated with MGT 401A is described hereinafter to avoid repetition. However, it shall be appreciated that each of the signals as applied to MGT 401A equally applies to MGTs 401B through 401D.

Transmit data signal 427, which in this example may be 64 bits for a word separated by offset bits, such as 16 offset bits for this example, is provided to a transmit scrambler and synch bit multiplexer block ("transmit scrambler") 404. This may be a parallel input of data. Frequency of operation of interface 201A on the transmit side may be equal to or greater than approximately 150 megahertz. Transmit scrambler 404 may provide 64 bit to 66 bit scrambling in accordance with IEEE specifications for this example. Transmit scrambler 404 scrambles transmit data obtained from transmit data signal 427 using a polynomial, such as the polynomial $1+X^{39}+X^{58}$, and splits such data into four sets for each of the four lanes 402A through 402D. Each word of data is 64 bits plus 2 synch bits, and respective words are provided to MGTs 401A through 401D.

In this embodiment, output of data from transmit scrambler 404 may be 66 bits for each word. It should be appreciated that transmit data signal 427 may be a 64-bit wide parallel signal, and thus a SERDES may be used to convert a parallel stream of data from transmit data signal 427 into a serial stream of data for transmission. This SERDES may be an IOB SERDES of IOB SERDES 442A through 442D respectively of MGTs 401A through 401D. Furthermore, such IOB SERDES may be used for clock recovery. Data provided from transmit scrambler 404 is provided in parallel to IOB SERDES 442A through 442D respectively of MGTs 401A through 401D for conversion to a serial signal for transmission, such as via transmit signal 429. Notably, the process of conversion to serial signals for transmission is not illustratively shown in FIG. 4 for purposes of clarity.

For an exemplary Xilinx FPGA implementation, MGTs have a 32-bit wide data interface on the internal side, namely for both transmit and receive directions. Accordingly, data words, such as 66-bit words provided from transmit scrambler 404, are respectively provided to MGTs 401A through 401D as portions of 66-bit words. Again, it should be appreciated that transmit data, and thus transmit data words, are distributed across MGTs for distributed transmission over multiple lanes, which transmit data may be aggregated on a receive side. Thus, it should be appreciated that data provided in the transmit direction is provided in 64-bit words, where portions of a word are provided to an MGT. The data rate conversion of 33 bits to 32 bits is used to accommodate a 32-bit interface of the MGT. This conversion is to accommodate not only the 32-bit interface but the addition of two synch bits to the 64-bit data word.

Because the data rate has changed from a 64-bit data rate to a 66-bit data rate owing to scrambling by transmit scrambler 404, a conversion for clock frequency to accommodate this change in data rate may be done. Transmit clock input signal 438 is provided to buffer 411. Output of buffer 411 is provided as an input to transmit scrambler 404 and to 33/32 fractional multiplier 302. Output of buffer 411 is a transmit input clock, which is the data rate divided by 64 for this example.

Multiplier 445 provides the conversion frequency for MGTs 401A through 401D, namely, frequency of MGT transmit reference clock input signal 431. Moreover, divider 408, which may be a divide-by-2 divider to accommodate providing 32 bits in parallel from transmit scrambler 404 to MGTs 401A through 401D for 66 bit words including the two synch bits, may be provided to buffer 413. Output of 413 may be a global transceiver reference clock signal 407 which is provided to each of MGTs 401A through 401D.

With respect to MGTs of a Xilinx FPGA, they may be operated in a low latency mode, and thus MGTs 401A through 401D may be operated in a low latency mode for a Xilinx FPGA embodiment. Furthermore, MGTs in a Xilinx FPGA have a Configurable Physical Coding Sub-layer ("CPCS") block, such as CPCS blocks 441A through 441D respectively of MGTs 401A through 401D. Thus, MGTs 401A through 401D may all be aligned to the same edge of transceiver reference clock signal 407 using CPCS blocks 441A through 441D respectively of MGTs 401A through 401D.

Figure 5:
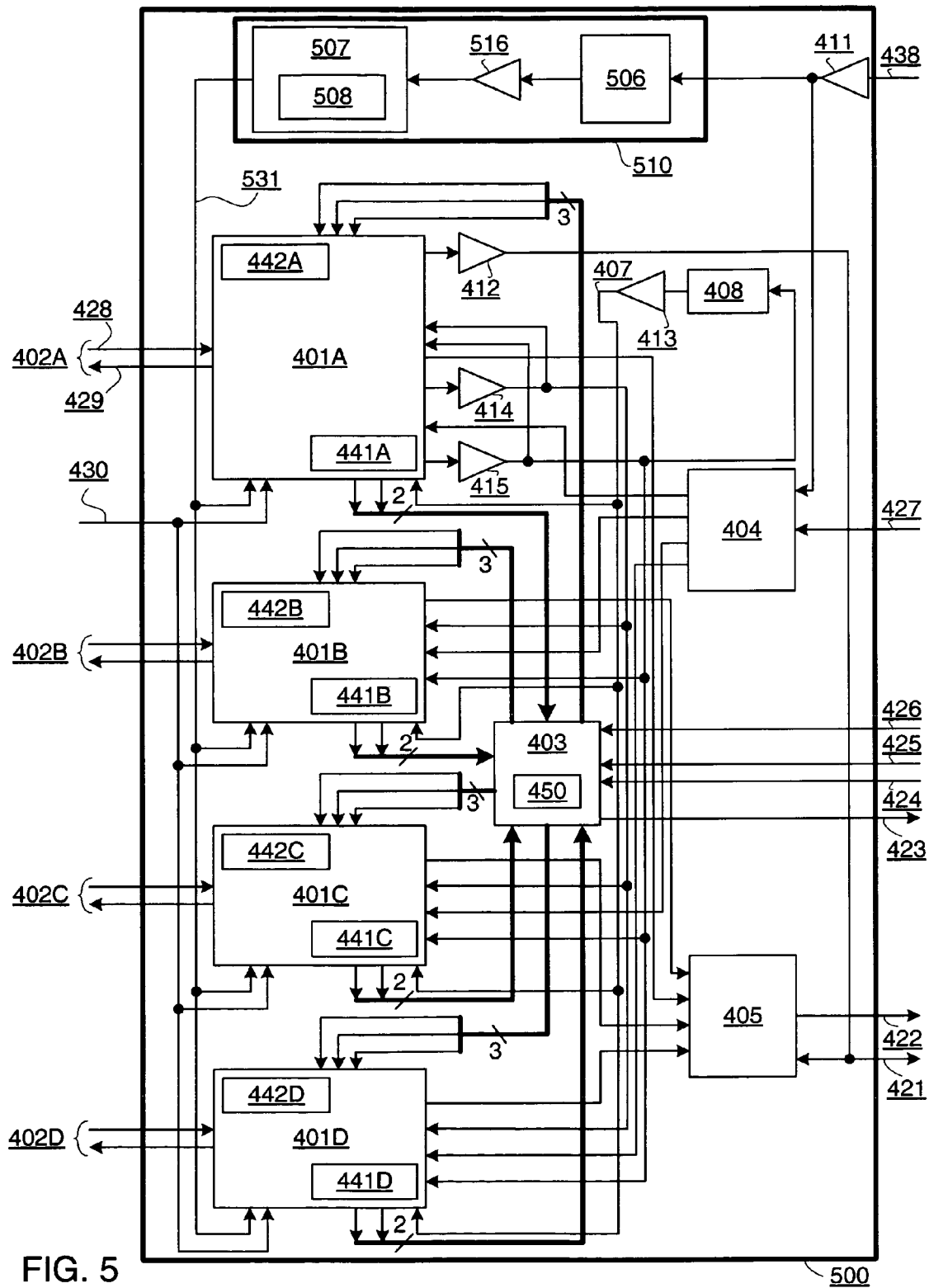
FIG. 5 is a block/schematic diagram depicting an alternative exemplary embodiment of a transceiver interface for SFI-4.02 implementation in programmable logic of an FPGA.

FIG. 5 is a block/schematic diagram depicting an alternative exemplary embodiment of a transceiver interface ("interface") 500 for implementation in programmable logic of an FPGA. With simultaneous reference to FIGS. 4 and 5, for interface 500 multiplier 445 is omitted and replaced with data rate conversions block 510. Interface 500 may be used for an interface 201A or 201B of FIG. 2. Notably, interface 500 in this particular embodiment is for an SFI-4.02 application implemented in a Xilinx FPGA having MGTs and DCMs. However, it should be appreciated that interface 500 is not limited to SFI-4.02 applications and may be used in other applications have equal or higher communication data rates.

For interface 500, output of buffer 411, in addition to being provided to transmit scrambler 404, is provided to a DPLL 506 of data rate conversion block 510. Output of DPLL 506 is provided to buffer 516, which buffer may be a BUFG as previously described for a Xilinx FPGA implementation. Output of buffer 516 is provided to MGT 507.

It should be understood that Xilinx FPGAs have MGTs that have PLLs. These PLLs are on a receive side of MGTs in a Xilinx FPGA, and thus may be used for providing data rate conversion in the receive direction. Accordingly, a PLL 508 of MGT 507 may be used as a receive PLL data rate converter. Notably, an MGT need not be used, if a locked-loop circuit is otherwise available for data rate conversion. Output of MGT 507 is provided as an MGT transmit reference clock input signal 531 to each of MGTs 401A through 401D. For the above-described embodiment, MGT 507 may be used as a multiply by 40 data rate converter, however other multiples may be used which may vary from application to application.

Thus, it should be appreciated that by internally providing MGT transmit clock input signal 531, the expense of multiplier 445 of FIG. 4 may be avoided. In other words, no external locked-loop circuit need be used for interface 500. Furthermore, use of internal signaling may enhance reliability.

MGTs 401A through 401D are synchronized with one another for transmit and receive directions. For SFI-4.02, the lane-to-lane skew specification is plus or minus 10 bits. In other words, lane-to-lane skew from end to end is at most plus or minus 10 bits for lanes 402A through 402D. Output of buffer 415 having a frequency of the data rate divided by 66 is provided to divider 408.

With reference to FIGS. 4 and 5, it should be noted that interface 400 or 500 may be implemented for double data rate ("DDR") support or single data rate ("SDR") support. For DDR support, it should be appreciated that there is twice as much tolerance of bit skew in comparison to SDR. In other words, SDR clock variation is for a full period, and DDR clock variation is allowed for a half period.

With continuing simultaneous reference to FIGS. 4 and 5, MGT skew synch block 403 is coupled to receive a transmit lock signal and a receive lock signal from each of MGTs 401A through 401D, as depicted in part in FIGS. 4 and 5 by heavier solid lines. MGT skew synch block 403 may be configured using one or more state machines to determine whether MGTs 401A through 401D are out of synch with one another in excess of the specified allowance, such as plus or minus some number of bits less than 10, and to reset MGTs 401A through 401D accordingly. It should be appreciated that control of resetting MGTs 401A through 401D is to ensure that such resetting is done for each of MGTs 401A through 401D synchronously in order to have alignment to a clock edge of global transceiver reference clock signal 407. Thus, MGT skew synch block 403 provides a receive reset/synch signal and a transmit reset/synch signal to each of MGTs 401A through 401D. Additionally, MGT skew synch block 403 provides a transmit disable signal to each of MGTs 401A through 401D which may be provided responsive to transmit disable signal 424. These reset/synch signals and disable signal are depicted in part in FIGS. 4 and 5 by heavier solid lines.

MGT skew synch block 403 receives transmit disable signal 424, reset signal 425, and switch action signal 426. Switch action signal 426 is to indicate to interface 400 or 500 that switch block 204 of FIGS. 2 and 3 has been reconfigured. MGT skew synch block 403 provides interface defects signal 423 to indicate whether any interface defects have been detected for purposes of fault management. Transmit disable signal 424 may be controllably provided to MGTs 401A through 401B via MGT skew synch block 403 as described above to temporally disable the transmit direction.

MGT skew synch block 403 reads each of the transmit and receive lock signals from the MGTs, such as MGTs 401A through 401D, in order to determine whether a change of state of any one or more of MGTs 401A through 401D has occurred. If a change of state on any one or more of MGTs 401A through 401D is detected, MGT skew synch block 403 provides either a receive or transmit reset/synch signal responsive to the direction of such change of state. This reset/synch signal is provided to each of the CPCSs 441A through 441D for interface protocol support and to ensure MGTs 401A through 401D are within tolerance with respect to edge and phase-aligned operation. It should further be appreciated that such reset/synch signal may be used to reset edge and phase alignment of MGTs 401A through 401D.

Another way of resetting MGTs 401A through 401D is to provide both a receive reset/synch signal and a transmit reset/synch signal from MGT skew synch block 403 to each of MGTs 401A through 401D responsive to reset signal 425 provided to MGT skew synch block 403. Reset signal 425 is to reset the interface, such as interface 400 or 500.

Interface defect signal 423 is to communicate defects to other interfaces of line card FPGA 300. Notably, in an implementation, global transceiver reference clock signal 407 input to each of MGTs 401A through 401D may be used to synchronize lanes 402A through 402D to minimize lane-to-lane skew to plus or minus 2 bits across the clock network of global transceiver clock signal 407. Notably, if lock is lost on any receive output of MGTs 401A through 401D, MGT skew synch block 403 forces all logic 0s or logic 1s as configured by the user to squelch the traffic.

To recap, MGTs 401A through 401D are aligned to global transceiver reference clock signal 407. However, it should be appreciated that MGT 401A is used to provide a transmit reference clock signal not only to itself but to each of MGTs 401B through 401D, namely the clock signal provided to buffer 415. However, on the receive side a somewhat different configuration is used. This is because in a Xilinx FPGA implementation, MGTs have a fractional divide capability in the receive direction. Notably, if MGTs in an alternative FPGA implementation have a fractional multiplier capability in the transmit direction, then multiplier 445 and data rate conversion block 510 respectively of FIGS. 4 and 5 may be omitted.

In the receive direction, MGTs are configured to do a fractional divide. Thus, receive clock output from MGT 401A, which is provided responsive to synchronization according to global transceiver reference clock signal 407, is output to buffer 414 for the 66 bit clock domain, namely the data rate divided by 66. The receive clock output from MGT 401A to buffer 412 is provided in the 64 bit clock domain, namely a frequency of the data rate divided by 64. This clock signal from buffer 412 is provided to receive descrambler 405. Additionally, receive data from each of MGTs 401A through 401D is provided to receive descrambler 405.

MGT 401A includes a PLL. This MGT 401A locks, whether it is a transmit lock or receive lock, to such PLL by use of internal counters being within a count tolerance. Once locked the PLL allows the MGT to switch to data transport provided the lock is not lost. It should be noted that MGT skew synch block 403 may include a filter 450 for filtering out receive lock bounce. In other words, receive lock bounce may be erroneously indicated to MGT skew synch block 403 that an MGT has lost lock when in fact it has not owing to some amount of inaccuracy between the PLL and the internal counters of MGTs. Thus, filter 450 may be used to counter receive lock bounces due to MGT skew. If internal counters of MGT 401A are within a count tolerance of one another a lock condition is declared. If, however, these counters drift to far apart an out-of-lock condition results. Thus transmit lock and receive lock may bounce between being locked and being unlocked. Accordingly, use of filter 450 allows this bounce to be filtered out. MGT skew synch block 403 thus may be configured to reset MGTs 401A through 401D if a lock condition has not transitioned for a period of time, which period of time may be configurable within MGT skew synch block 403. This reset of MGTs 401A through 401D causes receive descrambler 405 to reset. Receive descrambler 405 may be configured to account for some amount of delay between obtaining the received data and descrambling the bits of the received data. Receive descrambler 405 is configured to strip the synchronous bits for providing receive data 422.

In order to ensure that MGTs 401A through 401D are have the correct receive clock frequencies, MGTs 401A through 401D may be run at double the frequency of the data received on each of the lanes. For example, if data is being received on lanes 402A through 402D at approximately 2.5 Gb/s per lane, then each MGT 401A through 401D may be run at approximately 5 Gb/s. This facilities over-sampling such that receive descrambler 405 samples not each bit but every other bit. This over-sampling, namely providing every other bit as an output data bit for receive data signal 422, has to do with being able to provide both the data rate divided by 66 and data rate divided by 64 clock signals out of MGT 401A at the correct frequencies for a Xilinx FPGA implementation.

In the receive direction, all receive clock signals provided from the MGT 401A are aligned for each of the MGTs and each of MGTs 401A through 401D operates in a low latency mode. It should be appreciated that although a lane-to-lane skew of less than plus or minus 10 bits has been described above, there may be other bit skews associated with support circuitry other than skews among MGTs such as MGTs 401A through 401D. Accordingly, MGT lane-to-lane skew for MGTs 401A through 401D may be held to less than plus or minus four bits at a data rate of 2.5 Gb/s or higher. As previously mentioned, MGTs 401A through 401D may be operated at a data rate of approximately 5.0 Gb/s. Furthermore, for DDR operation, MGTs 401A through 401D may be held to a lane-to-lane skew of plus or minus two bits at the approximate data rates mentioned elsewhere herein.

Thus, it should be appreciated that data may be run across a back plane in a serial stream at a combined data rate of approximately 10 Gb/s using interface 400 or 500. Notably, for a Xilinx FPGA implementation, the low-jitter and low-skew clock input pins of MGTs 401A through 401D are only externally accessible. Thus, for block 510 output to MGTs, pin-to-pin off-chip coupling, though illustratively shown in FIG. 5 as an internal trace, would be used for such a Xilinx FPGA implementation.

Figure 6:
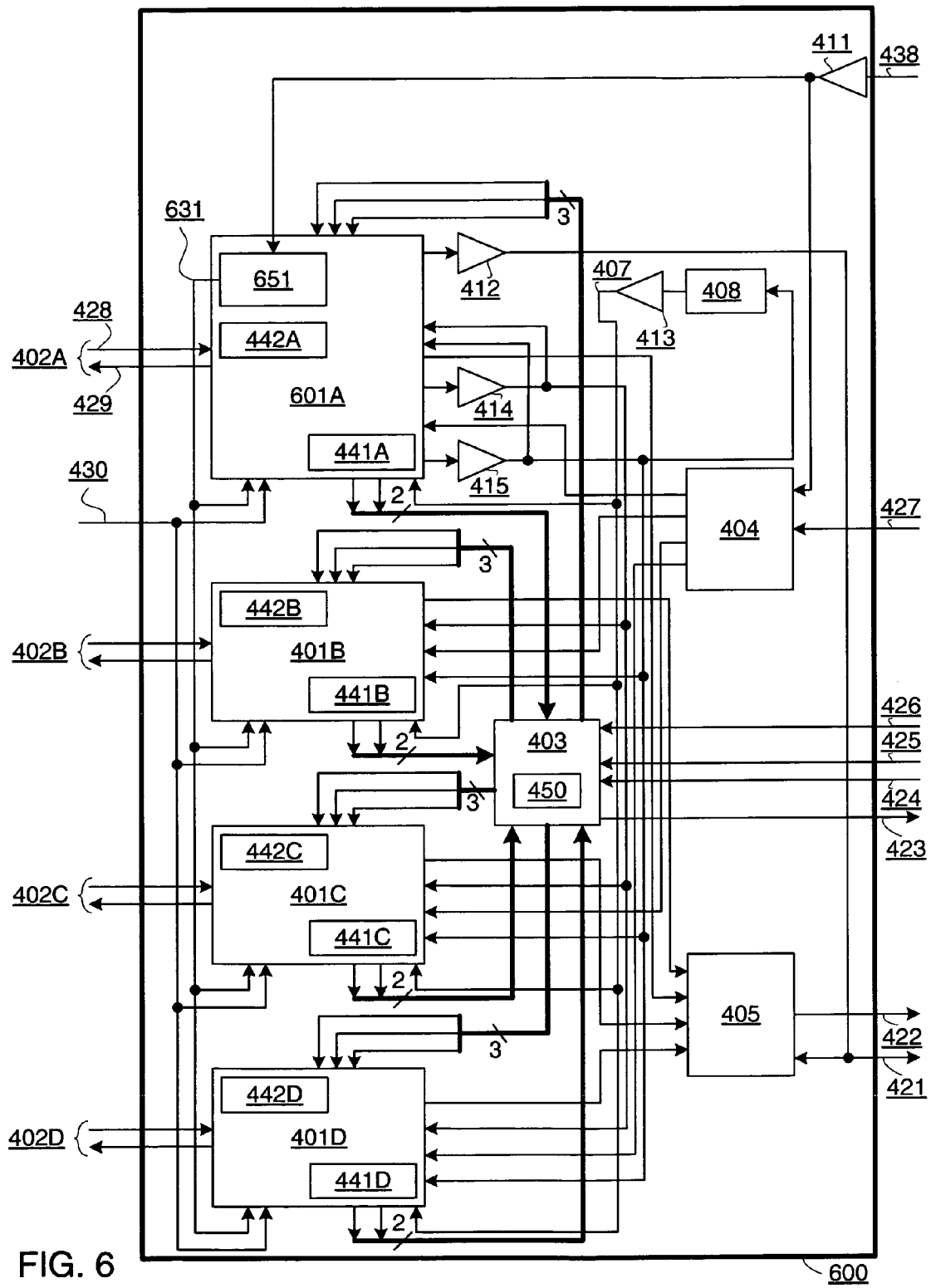
FIG. 6 is a block/schematic diagram depicting another alternative exemplary embodiment of a transceiver interface for SFI-4.02 implementation in programmable logic of an FPGA.

FIG. 6 is a block/schematic diagram depicting another alternative exemplary embodiment of a transceiver interface ("interface") 600 for implementation in programmable logic of an FPGA. In an alternate embodiment to interfaces 400 and 500 respectively of FIGS. 4 and 5, MGT 401A is replaced with MGT 601A which includes a fractional multiplier 651 for the transmit direction as illustratively shown in FIG. 6. In the embodiment illustratively shown in FIG. 6, multiplier 445 of FIG. 4 and data rate converter 510 of FIG. 5 are respectively replaced with fractional multiplier 651. Transmit clock output from buffer 411 is thus provided as an input to MGT 601A for fractional multiplier 651. Fractional multiplier 651 allows a 33-by-32-bit conversion for providing an MGT transmit reference clock signal 631. This transmit reference clock signal 631 may thus be provided to each of MGTs 401A through 401D.

Figure 7:
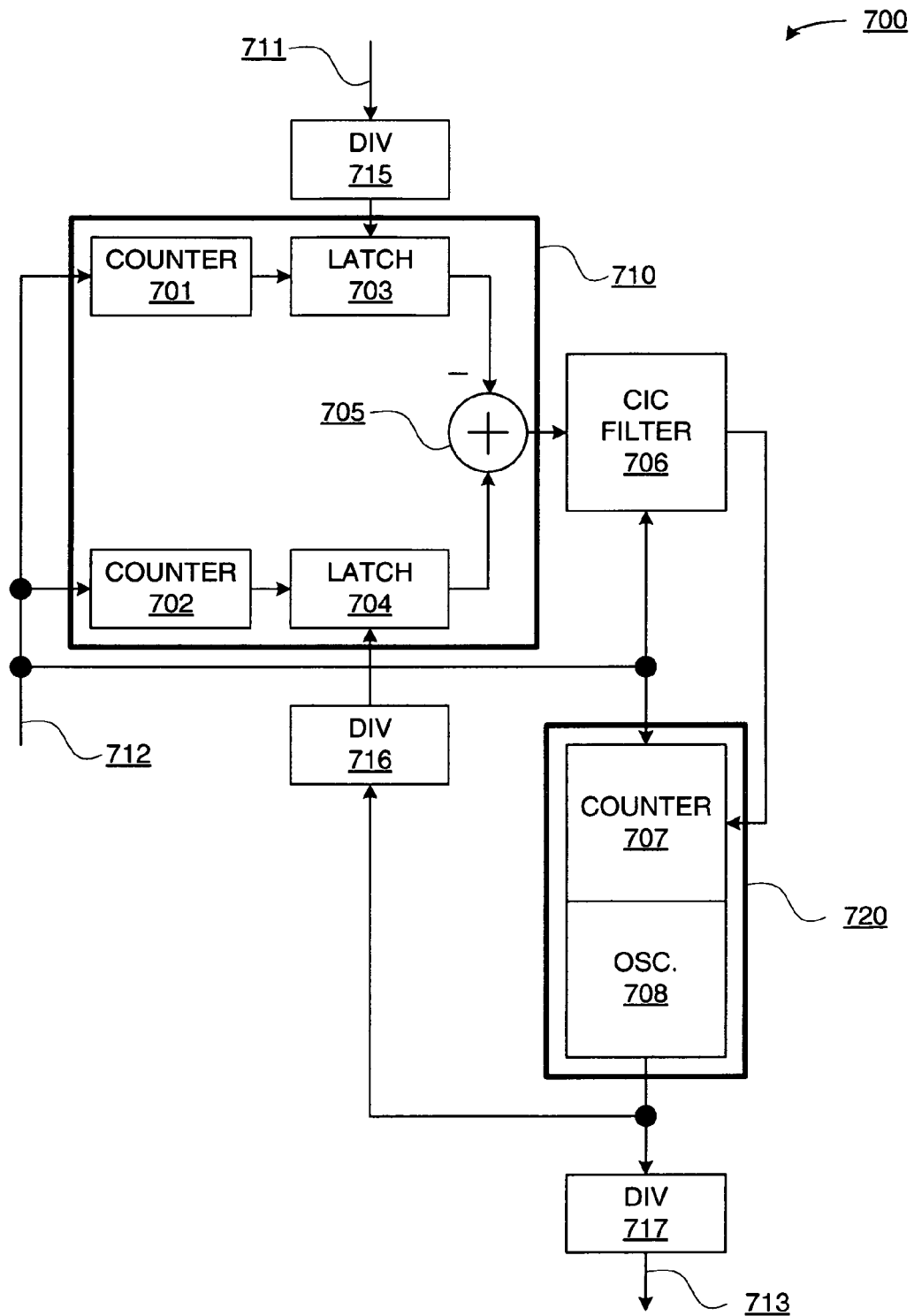
FIG. 7 is a block diagram depicting an exemplary embodiment of a digital phase locked loop.

FIG. 7 is a block diagram depicting an exemplary embodiment of a DPLL 700. DPLL 700 may be used for DPLL 506 of FIG. 5. DPLL 700 may be used to provide a fractional multiplier. Although the example of a 33/32 fractional multiplication is used for the purposes the above-described example of an SFI-4.02 interface, it should be appreciated that other values may be used depending on the application. In this particular example, an input clock signal 711 is provided to a divider 715. Input clock signal 711 may be approximately 155.52 to 177 MHz and divider 715 may be a divide-by-40 divider. Output of divider 715 is provided to latch 703 of frequency detector 710.

A reference clock signal 712 is provided to counter 701 and 702 of frequency detector 710 as well as to filter 706 and digitally controlled oscillator ("DCO") 720. In the above example, reference clock signal 712 may originate as an approximately 311 to 350 MHz clock signal, which is divided by 2 to provide reference clock signal 712.

Frequency detector 710 includes counters 701 and 702, latches 703 and 704, and subtractor 705. Responsive to reference clock signal 712, counter 701 and 702 count. Output from counter 701 is provided to latch 703, along with output from divider 715. Output of counter 702 is provided to latch 704. Another input to latch 704 is output from divider 716. Divider 716 may be a divide-by-33 divider for providing the 33 part of the 33/32 fractional multiply. Accordingly, counters 701 and 702 may each be 32 bit counters and latches 703 and 704 may each be 32-bit latches. Output of latches 703 and 704 is provided to subtractor 705. Accordingly, it should be appreciated that frequency detector 710 samples the frequency of clock signals 711 and 712 and subtracts the sampled clocks to obtain a phase difference between them. Output of subtractor 705 indicates such phase difference.

Output of subtractor 705 is provided to filter 706. Filter 706 may be a loop filter. An example of such a loop filter may be a Cascaded Integrator-Comb ("CIC") filter. Again, it should be appreciated that filter 706 is clocked responsive to reference clock signal 712, as is DCO 720. Output of filter 706 is provided to counter 707 of DCO 720. Furthermore, reference clock signal 712 is provided to counter 707 of DCO 720. Counter 707 may be a 32-bit counter with programmable increment capability. Counter 707 is coupled to oscillator 708 of DCO 720.

Oscillator 708 may be a programmable ring oscillator. Notably, the resolution of oscillator 708 may depend on the application. For the above exemplary embodiment of an SFI-4.02 interface, oscillator 708 may have a 75 pico-second ("ps") resolution. It should be appreciated that counter 707 output is used to control tap delay on programmable ring oscillator 708 to obtain a target frequency. Oscillator 708 outputs such a target frequency to divider 716, which divides such a frequency by 33. Output of oscillator 708 is further provided to divider 717 to provide clock output signal 713. Divider 717 may be a divide-by-4 divider. In this particular example, clock output signal 713 may be equal to clock input signal 711 divided by five multiplied by the fraction 33/32.

DCO 720 in this exemplary configuration provides approximately a 0.069 hertz frequency tuning resolution. This is done using a CIC filter for filter 706 for loop bandwidth control. Notably, in this configuration, a loop bandwidth may be controlled down to the KHz range, which may significantly reduce jitter.

Figure 8:
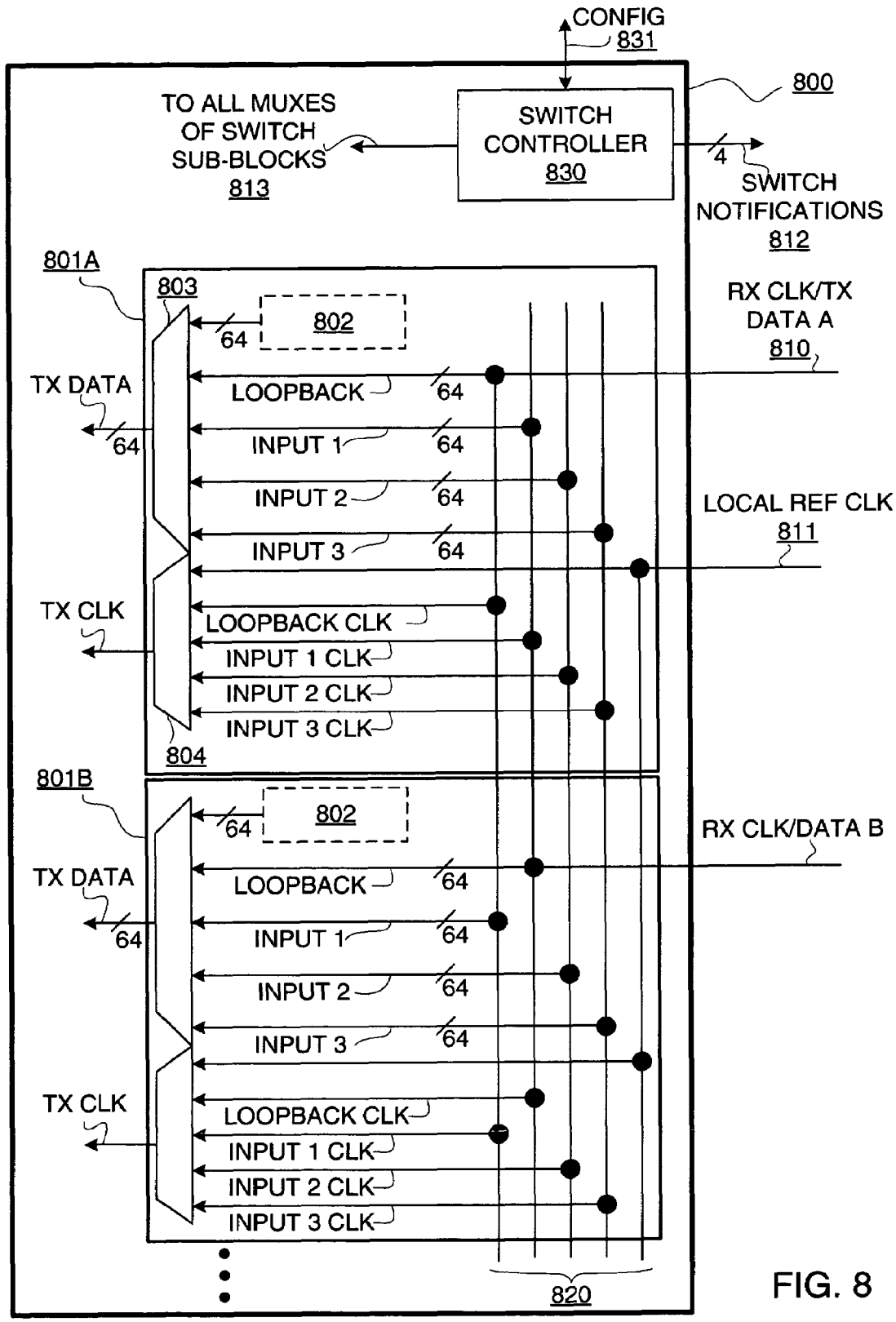
FIG. 8 is a block/schematic diagram depicting an exemplary embodiment of a switch block.

FIG. 8 is a block/schematic diagram depicting an exemplary embodiment of a switch block 800. Switch block 800 may be used for switch block 204 of FIGS. 2 and 3. Switch block 800 includes switch controller 830 and switch sub-blocks for each interface. Although only two switch sub-blocks 801A and 802A, such as respectively for interfaces 201A and 201B, are specifically shown, it should be appreciated that switch sub-blocks may be provided for interfaces 201C and 201D using lines 820, as generally indicated. These other switch sub-blocks are not described in unnecessary detail for purposes of clarity.

With simultaneous reference to FIGS. 2 and 8, each switch sub-block 801A and 801B includes a respective optional pattern generator 802, transmit data output multiplexer 803, and transmit clock output multiplexer 804. Switch controller 830 provides control signaling 813 to each multiplexer 803 and 804 of all switch sub-blocks, though not shown coupled for purposes of clarity in FIG. 8. Switch controller 830 configures multiplexers 803 and 804 responsive to configuration information 831 provided via processor interface 203. Additionally, switch controller 830 provides a respective switch notification 812 for each respective interface, such as for each interface 201A through 201D of line card FPGA 200, when a transmit input associated therewith has switched via an edge indication.

Output of pattern generator 802 is provided to a respective transmit data output multiplexer 803, along with receive clock/transmit data ("RX CLK/TX DATA") signals 810 for that respective switch sub-block, as described with reference to switch sub-block 801A. Notably, as each of the switch sub-blocks have generally the same configuration, only switch sub-block 801A is described in detail herein for purposes of clarity. Each switch sub-block receives a local reference clock signal 811 to each multiplexer 804. Notably, there are no BUFGs in this example implementation of switch block 800, as clock signals are multiplexed and then sent for global clock buffering.

Each interface 201A through 201D may include at least two ports to allow any of such interfaces to communicate with any other of such interfaces in either a forward or reverse direction. Moreover, it should be appreciated that an optional pattern generator 802 allows any interface of interfaces 201A through 201D to have a pattern generated for its output timed to a received clock signal, such as of receive clock/transmit data A 810 for switch sub-block 801A. This may be achieved by using a receive clock signal as a loopback clock signal input to each of multiplexers 803 and 804. Thus, patterns to be generated are repeating a 64-bit pattern, for example, loaded in a register. Notably, there may be one pattern per each interface, such as interfaces 201A through 201D.

Figure 9:
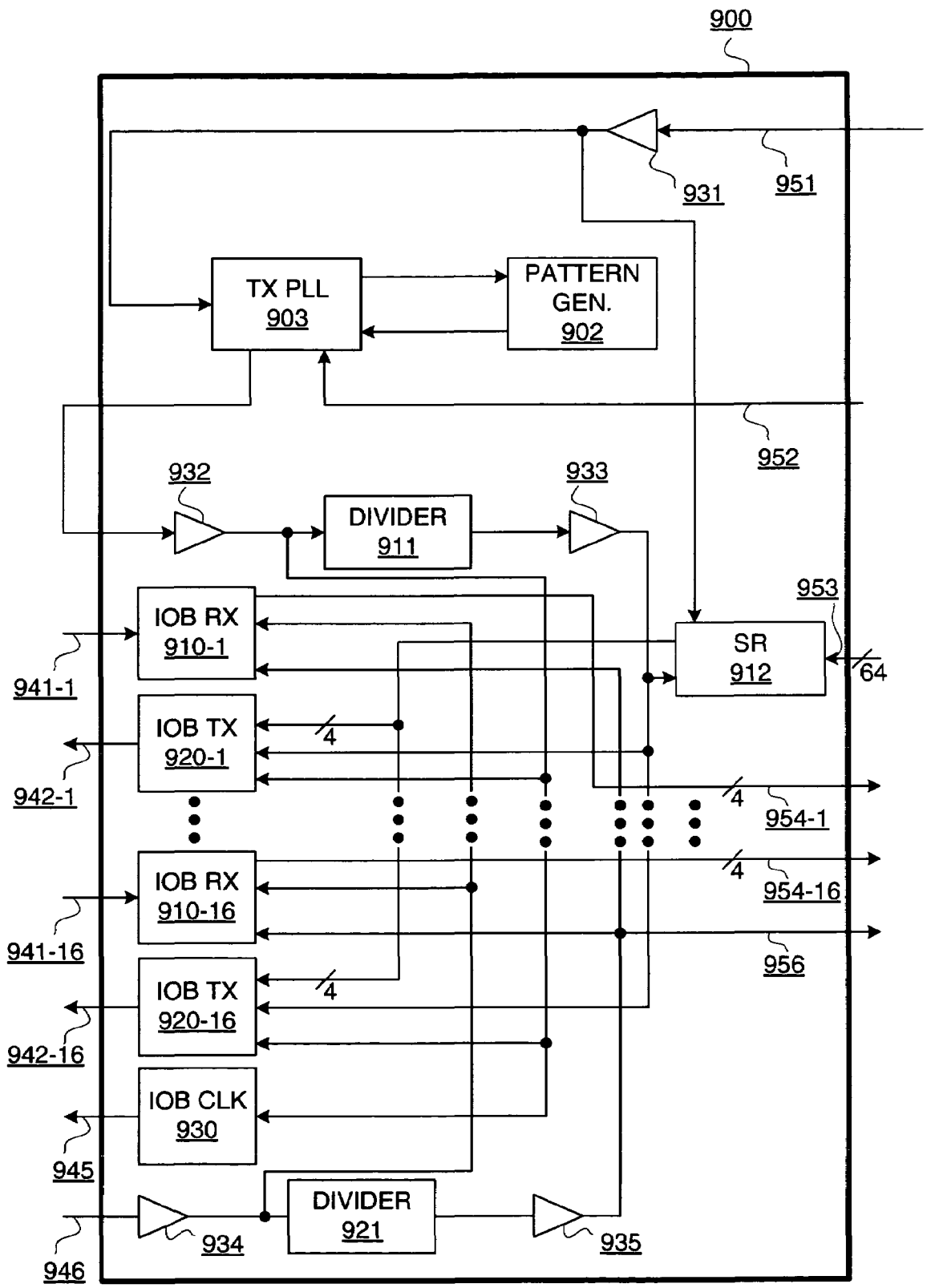
FIG. 9 is a block/schematic diagram depicting an exemplary embodiment of a serializer-deserializer for use with SFI-4.01 interfaces of FIG. 2.

FIG. 9 is a block/schematic diagram depicting an exemplary embodiment of a SERDES 900 for use with interfaces 201C and 201D of FIG. 2. Notably, a 622 MHz clock signal for an SDR clock may exceed an internal frequency for implementation of a portion of a SERDES in an FPGA, such as a maximum frequency of 500 MHz. To adjust down the frequency for an SFI-4.01 interface, SERDES 900 may be used. Notably, for FIG. 9, signals illustratively shown on the right side of SERDES 900 are FPGA internal signals, and signals illustratively shown on the left side of SERDES 900 are FPGA external signals.

A transmit clock input signal 951 is provided as an input to BUFG 931. Output of BUFG 931 is a transmit reference clock input signal and is provided to transmit PLL ("TX PLL") 903 and to shift register ("SR") 912. Transmit PLL may be configured as a multiply an input by-32 multiplier. An output of transmit PLL 903 is provided to pattern generator 902 as a transmit clock output signal, which may have a frequency that is the data rate divided by 16. Optionally, an MGT reset signal 952 may be provided to transmit PLL 903 to accommodate switching of clock signals. Pattern generator 902 may be a 0-by-55 pattern generator to provide a pattern of logic 0s and logic 1s, such as a 1010 . . . pattern, as a transmit data output to transmit PLL 903. This data output by pattern generator 902 may be 32 bits.

An MGT transmit serial output from transmit PLL 903, which may be at the data rate divided by 16, is provided to I/O buffer 932 as a pattern obtained from the pattern generator. For a Xilinx FPGA implementation, this MGT transmit output may be provided off-chip for providing to an MGT transmit clock input pin of the FPGA; however, alternatively an internal trace may be provided for this interconnect. This transmit clock input to I/O buffer 932 is a clock signal which effectively has its frequency halved due to a pattern of alternating logic 1s and logic 0s output from TX PLL 903 responsive to input from pattern generator 902. For example, the frequency of the signal input to buffer 932 may be approximately 622 MHz for an SDR clock signal.

Transmit IOBs ("IOB TXs") 920-1 through 920-16 are capable of operating at the 622 MHz SDR clock to provide 16 respective transmit data streams 942-1 through 942-16, and thus output of buffer 932 may be provided as a transmit serial clock signal to transmit IOBs 920-1 through 920-16. Moreover, this transmit serial clock signal may be provided to IOB clock 930 to provide a transmit clock output 945.

However, to convert from 64 bits down to 16 bits, output of buffer 932 is also provided to divider 911, which may be a divide-by-4 divider. This reduces that frequency of clock signal to a fraction of 622 MHz. Output of divider 911 is provided to BUFR 933. The output of BUFR 933 is a transmit parallel clock which is provided to transmit IOBs 920-1 through 920-16 and to shift register 912. Accordingly, 4 bits of data in parallel are respectively provided from shift register 912 to each of transmit IOBs 920-1 through 920-16 to provide 64-bit words for transmission. Shift register 912 receives transmit data signal 953 as bused 64-bit words in parallel.

On the receive side, receive data 941-1 through 941-16 is respectively provided to receive IOBs 910-1 through 910-16. A receive clock input 946, which may be at the data rate divided by 16, is provided to I/O buffer 934. Output of I/O buffer 934, which is a receive serial clock signal, is provided to receive IOBs 910-1 through 910-16 and to divider 921. Output of divider 921, which may be a divide-by-4 divider, is provided to BUFR 935. Output of BUFR 935 is provided as a receive parallel clock signal to receive IOBs 910-1 through 910-16 and as receive clock signal 956. Receive data output from receive IOBs 910-1 through 910-16 is provided as 4 bits in parallel, namely receive data signals 954-1 through 954-16, which collectively form a 64 bit receive data bus.

It should be appreciated that receive and transmit clocks may be independent of one another. Furthermore, it should be appreciated that adjustments responsive to receive and transmit synch adjustment signals may be done internally within an MGT or externally to an MGT. Accordingly, while the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A high-speed interface for implementation in a programmable device, comprising:

multi-gigabit transceivers of the programmable device each including locked-loop circuitry to provide transmit and receive lock signals;

the multi-gigabit transceivers configured with inputs for a reference transmit clock signal and a reference receive clock signal;

one of the multi-gigabit transceivers configured to provide a first transmit clock signal, a first receive clock signal, and a second receive clock signal;

the first transmit clock signal provided responsive to the reference transmit clock signal;

the first receive clock signal and the second receive clock signal provided responsive to the reference receive clock signal or derived from received data;

the first receive clock signal having a first frequency;

the second receive clock signal having a second frequency different from the first frequency of the first receive clock signal;

the multi-gigabit transceivers coupled to obtain the first transmit clock signal and the first receive clock signal to include feed back of the first transmit clock signal and the first receive clock signal to the one of the multi-gigabit transceivers;

the first transmit clock signal for providing a transceiver reference clock signal to each of the multi-gigabit transceivers for referencing the multi-gigabit transceivers to the one of the multi-gigabit transceivers for synchronizing the multi-gigabit transceivers to control lane-to-lane skew;

a data rate converter coupled to obtain a second transmit clock signal and configured to fractionally multiply the second transmit clock signal to provide the reference transmit clock signal;

a skew synchronization block coupled to obtain the transmit and receive lock signals from each of the multi-gigabit transceivers;

the skew synchronization block configured to provide respective receive and transmit synch adjustment signals to each of the multi-gigabit transceivers; and the receive and transmit synch adjustment signals for respectively adjusting synchronous operation of the multi-gigabit transceivers in receive and transmit directions to maintain the lane-to-lane skew for the high-speed interface within a target range.

2. The high-speed interface according to claim 1, further comprising:

a descrambler coupled to obtain the receive data from the multi-gigabit transceivers, the descrambler configured to align the receive data and to strip synch bits from the receive data;

the one of the multi-gigabit transceivers coupled to the descrambler to provide the second receive clock signal thereto; and a scrambler coupled to obtain the second transmit clock signal and to obtain transmit data, the scrambler being configured to add synch bits to the transmit data and to apportion the transmit data to the multi-gigabit transceivers for transmission.

3. The high-speed interface according to claim 2, wherein the skew synchronization block, the scrambler and the descrambler are provided using programmable logic of the programmable device.

4. The high-speed interface according to claim 2, wherein the data rate converter is coupled externally to the programmable device, the data rate converter being a fractional multiplier.

5. The high-speed interface according to claim 2, wherein the data rate converter is located in the one of the multi-gigabit transceivers, the data rate converter being a fractional multiplier.

6. The high-speed interface according to claim 2, wherein the data rate converter is located in the programmable device, the data rate converter including a digital phase-locked loop coupled to a receive-side phase-locked loop.

7. The high-speed interface according to claim 2, wherein the first frequency of the first receive clock signal is a data rate divided by 66; and wherein the second frequency of the second receive clock signal is the data rate divided by 64.

8. The high-speed interface according to claim 7, wherein the first frequency of the first receive clock signal is equal to a third frequency of the first transmit clock signal, the third frequency being the data rate divided by 66.

9. The high-speed interface according to claim 8, wherein each of the multi-gigabit transceivers has a 32-bit data interface.

10. The high-speed interface according to claim 9, further comprising a divider coupled to obtain the first transmit clock signal and configured to divide the first transmit clock signal to provide the transceiver reference clock signal, the divider coupled to each of the multi-gigabit transceivers to provide the transceiver reference clock to each of the multi-gigabit transceivers.

11. The high-speed interface according to claim 10, wherein the data rate converter is configured to provide a fractional multiplication of 33/32 of the second transmit clock signal.

12. The high-speed interface according to claim 1, wherein the target range of the lane-to-lane skew is approximately 0 to 10 bits; and wherein the high-speed interface is approximately at least a 10 gigabits per second interface.

13. The high-speed interface according to claim 12, wherein there are four of the multi-gigabit transceivers to provide four lanes.

14. The high-speed interface according to claim 1, wherein each of the multi-gigabit transceivers include a respective configurable Physical Coding Sub-layer block.

15. The high-speed interface according to claim 14, wherein the configurable Physical Coding Sub-layer block of each of the multi-gigabit transceivers is configured for a low latency mode for aligning each of the multi-gigabit transceivers to a same edge of the transceiver reference clock signal.

16. A method for providing a high-speed interface, comprising:

providing a programmable device having multi-gigabit transceivers and programmable logic;

coupling each of the multi-gigabit transceivers to obtain transmit reference clock signaling and receive reference clock signaling;

configuring one of the multi-gigabit transceivers to provide transmit and receive output clock signaling, the transmit and receive output clock signaling provided as a first receive portion, a second receive portion and a transmit portion, the first receive portion and the second receive portion having different frequencies and provided responsive to receive the reference clock signaling or received data, the transmit portion provided responsive to the transmit reference clock signaling;

obtaining by each of the multi-gigabit transceivers the first receive portion and the transmit portion from the one of the multi-gigabit transceivers;

providing a transceiver clock signal to each of the multi-gigabit transceivers responsive to the transmit portion;

referencing the multi-gigabit transceivers to the one of the multi-gigabit transceivers for synchronizing the multi-gigabit transceivers to control lane-to-lane skew for a transmit direction;

instantiating a data rate converter coupled to obtain a transmit input clock signal and configured to fractionally multiply the transmit input clock signal to provide the transmit reference clock signaling;

instantiating in the programmable logic a skew synchronization block coupled to obtain respective transmit and receive lock signals from each of the multi-gigabit transceivers;

obtaining from the skew synchronization block respective sets of receive and transmit synch adjustment signals by each of the multi-gigabit transceivers; and adjusting synchronous operation of the multi-gigabit transceivers in receive and transmit directions to maintain the lane-to-lane skew for the high-speed interface within a target range, the adjusting in the receive and transmit directions respectively responsive to the receive and transmit synch adjustment signals.

17. The method for providing the high-speed interface according to claim 16, further comprising:

instantiating in the programmable logic a descrambler and a scrambler;

obtaining the received data by the descrambler from the multi-gigabit transceivers;

obtaining the second receive portion of the transmit and receive output clock signaling by the descrambler;

aligning the received data and stripping synch bits from the received data with the descrambler;

obtaining transmit data and the transmit input clock signal by the scrambler; and adding synch bits to the transmit data and apportioning the transmit data with the synch bits to the multi-gigabit transceivers by the scrambler;

wherein the target range of the lane-to-lane skew is approximately 0 to 10 bits; and wherein the high-speed interface is approximately at least a 10 gigabits per second interface.

18. The method for providing the high-speed interface according to claim 17, wherein each of the multi-gigabit transceivers include a respective configurable Physical Coding Sub-layer block, the configurable Physical Coding Sub-layer block of each of the multi-gigabit transceivers being configured for a low latency mode for aligning each of the multi-gigabit transceivers to a same edge of the transceiver clock signal.

* * * * *